United States Patent [19]

Kakihara

[11] Patent Number: 4,834,809
[45] Date of Patent: May 30, 1989

[54] THREE DIMENSIONAL SEMICONDUCTOR ON INSULATOR SUBSTRATE

[75] Inventor: Yoshinobu Kakihara, Nara, Japan

[73] Assignee: Sharp Kabushiki Kaisha, Osaka, Japan

[21] Appl. No.: 96,758

[22] Filed: Sep. 9, 1987

Related U.S. Application Data

[63] Continuation of Ser. No. 799,639, Nov. 19, 1985, abandoned.

[30] Foreign Application Priority Data

Nov. 19, 1984 [JP] Japan ................... 59-244277

[51] Int. Cl.$^4$ ................. H01L 21/248; H01L 21/365; C30B 25/04
[52] U.S. Cl. ................... 148/33; 148/DIG. 11; 148/DIG. 25; 148/DIG. 71; 148/DIG. 90; 148/DIG. 152; 148/33.2; 148/33.3; 156/613; 156/603; 437/26; 437/33; 437/62; 437/82; 437/108; 437/973; 357/34
[58] Field of Search ............ 148/DIG. 25, 11, 65, 148/71, 72, 90, 97, 150, 152, 33, 33.2, 33.3; 156/610, 612, 613, 684, 603, 606; 357/34, 16, 60; 437/26, 31, 33, 62, 82, 83, 84, 108, 173, 973

[56] References Cited

U.S. PATENT DOCUMENTS

| | | | |
|---|---|---|---|
| 3,826,699 | 7/1974 | Sawazaki et al. | 437/62 |
| 3,840,409 | 10/1974 | Ashar | 437/62 |
| 3,855,009 | 12/1974 | Lloyd et al. | 437/26 |
| 3,976,511 | 8/1976 | Johnson | 437/26 |
| 4,147,584 | 4/1979 | Garrison et al. | 156/612 |
| 4,368,098 | 1/1983 | Manasevit | 156/614 |
| 4,448,632 | 5/1984 | Akasaka | 156/603 |
| 4,490,182 | 12/1984 | Scovell | 437/26 |
| 4,534,099 | 8/1985 | Howe | 29/572 |
| 4,540,452 | 9/1985 | Croset et al. | 156/614 |
| 4,569,700 | 2/1986 | Toyama | 148/174 |
| 4,578,142 | 3/1986 | Corboy, Jr. et al. | 156/612 |

FOREIGN PATENT DOCUMENTS 0038278 4/1978 Japan ................... 437/62

OTHER PUBLICATIONS

Roy A. Colclaser, "Microelectronics", John Wiley & Sons, New York, N.Y., 1980, p. 53.
John H. Douglas, "The Route to 3-D Chips", High Technology, Sep. 1983, pp. 55–59.
Ghandhi, VLSI Fabrication Principles, John Wiley & Sons, New York, N.Y., 4/5/1983, pp. 231–234.
Thorson et al., "Heteroepitaxial GaAs on Aluminum Oxide . . . ", J. Appl. Phys., vol. 42, No. 6, May 1971, pp. 2519–2527.

Primary Examiner—Brian E. Hearn
Assistant Examiner—William Bunch
Attorney, Agent, or Firm—Birch, Stewart, Kolasch & Birch

[57] ABSTRACT

A semiconductor substrate includes: a first monocrystalline semiconductive layer formed on the surface of a crystalline silicon substrate with the intervention of a first insulation film; a second insulation film set to the upper surface of the first monocrystalline semiconductive layer and provided with a plurality of apertures each having a specific pattern; and a second monocrystalline semiconductive layer which is epitaxially grown by the seed crystallization process and provided with the same crystalline characteristics as that of the first monocrystalline semiconductive layer.

Accordingly, the preferred embodiment of the present invention provides an extremely useful semiconductor substrate which easily isolates the elements of semiconductor devices between layers of insulating film described above.

13 Claims, 1 Drawing Sheet

THREE DIMENSIONAL SEMICONDUCTOR ON INSULATOR SUBSTRATE

This application is a continuation, of application No. 799,639 filed on Nov. 19, 1985, now abandoned.

BACKGROUND OF THE INVENTION

1. Field of the Invention

The present invention relates to a semi-conductive substrate, more particularly, to a semiconductive substrate ideally suited for application to high-density and high-performance semiconductor devices.

2. Description of Related Art

Recent research into the development of a SOI (silicon on insulator) mainly comprising a three-dimensional circuit element has been intensively conducted by many industries, and there is a growing drive to develop highly functional semiconductor devices incorporatng a multi-layer semiconductive substrate. While two-dimensional very-large-scale integrated circuits (VLSI) are provided with still faster operating speeds and higher densities, conventional P-N junction isolation methods used for bipolar transistors have limitations not only in the reduction of parasitic capacitance but also into the fine pattern fabrication in the integrated circuits (IC). To overcome the disadvantages, the bipolar transistors isolated by oxidized layers are currently of interest. Nevertheless, there are concerns about the processing of bipolar transistors using the oxidized-layer isolation method, for if they, too, were subjected to still further miniaturizing processes, such as submicron-order processing for example, it is anticipated that the possibilities of realizing yet higher integration and faster operating speeds would eventually face a critical limit, as is the case with the P-N junction isolation method. Likewise, although a wide variety of experiments have actually been made to hasten the early commercial production of sapphire substrates, because of the high cost of the sapphire substrate itself, insufficient electrical characteristics, and inadequate crystallization of the monocrystalline silicon semiconductive layer formed on the sapphire substrate, no sapphire substrate has ever been employed in any of the existing semiconductor devices on a commercial production basis.

OBJECTS AND SUMMARY OF THE INVENTION

Object of the Invention

One of the primary objects of the present invention is to provide a semiconductive substrate for manufacturing semiconductive devices featuring high-density and high-speed operating performance. Another object of the present invention is to provide a semiconductor substrate capable of easily isolating the elements needed for realizing high-performance semiconductor devices.

Other objects and further scope of the applicability of the present invention will become apparent from the detailed description given hereinafter. It should be understood, however, that the detailed description and specific examples, while indicating the preferred embodiments of the invention, are given by way of illustration only, since various changes and modifications within the spirit and scope of the invention will become apparent to those skilled in the art from the following detailed description.

SUMMARY OF THE INVENTION

The present invention provides a semiconductor substrate made of the following, sequentially layered substances including: a first monocrystalline semiconductive layer formed on the surface of a crystalline silicon substrate with the intervention of a first insulation film; a second insulation film set to the upper surface of the first monocrystalline semiconductive layer and providing with a plurality of apertures having specific patterns; and a second monocrystalline semiconductive layer which is epitaxially grown by the seed crystallization process and provided with the same crystalline characteristics as that of the first monocrystalline semiconductive layer.

BRIEF DESCRIPTION OF THE DRAWINGS

The present invention will be better understood from the detailed description given hereinbelow and the accompanying drawings which are given by way of illustration only, and thus are not limitative of the present invention and wherein.

DETAILED DESCRIPTION OF THE PREFERRED EMBODIMENTS

Figure 1:
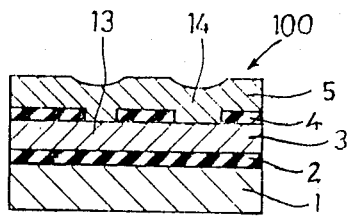
FIG. 1 is a sectional view representing the principle of one of the preferred embodiment of the semiconductor substrate related to the present invention.
Figure 2C:
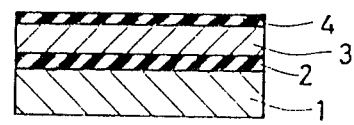
FIGS. 2(A) through 2(D) are respectively sectional views of the semiconductor substrate of FIG. 1 during the production process.
Figure 2A:

FIG. 1 is a sectional view of a semiconductor substrate 100, whereas FIGS. 2(A) through 2(D) are respectively production process diagrams for making the semiconductor substrate. Referring now to FIG. 2(A), the semiconductor substrate 100 is provided with a crystallized silicon semiconductor substrate 1 and a first insulation film 2 comprising oxidized monocrystalline film.

The first insulation film 2 substantially comprises stabilized zirconia film ($ZrO_2 \cdot Y_2O_3$, $ZrO_2 \cdot MgO$, $ZrO_2 \cdot Sn_2O_3$), spinel film and sapphire film, which are respectively treated by the sputtering process, the metal organic-chemical vapor-phase deposition (MOCVD) process, the atomic-layer epitaxy (ALE) process, the ionized cluster-beam (ICB) process, and the ion plating process. In the next process, as shown in FIG. 2(B), by applying a silicon epitaxial processor, a monocrystalline silicon semiconductor n+layer 3 which is substantially the first monocrystalline semiconductive layer corresponding to the second n+layer, is formed on the first insulation film 2 using monosilane ($SiH_4$) and arsine ($ASH_4$). Next, as shown in FIG. 2(C), a second insulation film 4 is laid onto the upper surface of the semiconductive layer 3. Either oxidized monocrystalline film or amorphous oxidized film is used for the second insulation film 4, where those oxidized film materials such as $SiO_2$, $Ta_2O_5$, $Al_2O_3$, $Y_2O_3$, etc. for example, can be made available. However, other oxidized materials may also be made available for forming the second insulation film 4.

Figure 2D:
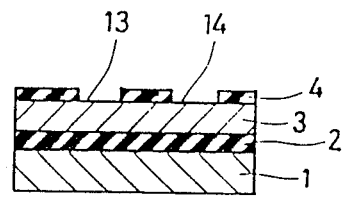
Figure 2B:
Figure 3:
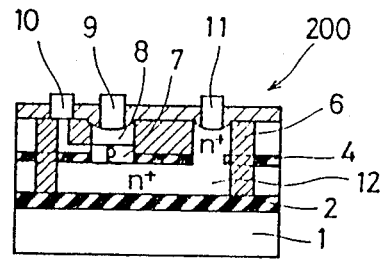
FIG. 3 is also a sectional view representing the principle of a semiconductor device incorporating the semiconductor substrate embodied by the present invention.

Next, as shown in FIG. 2(D), by applying either reactive ion etching (RIE) a wet etching process, two apertures 13 and 14 are provided for the second insulation film 4 in a specific pattern. Finally, by applying the same silicon epitaxial processor and raw materials as those used for the process shown in FIG. 2(B), an n layer 5 of FIG. 1 of the monocrystalline silicon semiconductor, which is substantially the second monocrystalline semiconductive layer, containing a minimum concentration of arsenic, is grown on the upper surface of the second insulation film 4 by the conventional seed crystallization process, thus completing the production of semiconductor substrate 100 shown in FIG. 1. Note that, the n layer 5 of the silicon semiconductor has crystallization characteristics identical to those of the n+ layer 3 of the silicon semiconductor, and in addition to silicon both of these semiconductive layers 3 and 5 can also be made from III and V group metal compounds such as gallium arsenate (GaAs). FIG. 3 is a sectional view of a semiconductor device 200 manufactured by applying the semiconductor substrate 100. The semiconductor device 200 is provided with an oxidized film 6, a base p-layer 7, an emitter n-layer 8, an emitter electrode 9, a base electrode 10, a collector electrode 11, and a collector layer 12, respectively.

Since the n layer 5 of the monocrystalline silicon semiconductor is epitaxially grown all over the surfaces of the insulation layer 4 which is provided with two apertures 13 and 14 in a specific pattern, the n layer 5 of monocrystalline silicon semiconductor can securely maintain crystallization characteristics of the n+ layer 3, and, as a result, it is possible for the system to realize a semiconductor substrate featuring extremely satisfactory crystalline characteristics. If the insulation layer 4 is made from amorphous oxidized film, the monocrystalline sillicon semiconductive layer formed on the film will eventually become polysilicon.

However, as is clear from the preferred embodiment thus far described, the n layer 5 of the monocrystalline silicon semiconductor embodied by the present invention horizontally maintains the crystalline characteristics of the n+ layer 3 of the semiconductor, and as a result, the n layer 5 can be monocrystallized so that its own crystalline characteristics can be eventually improved. Furthermore, since the insulationlayer 4 can be usefully applied to the isolation of both electrodes and elements of semiconductor devices, manufacturers can effectively simplify all the production processes of such semiconductor devices, and in addition, it is also possible for the entire system to achieve a faster operating speed, a higher density of part installation, and integration of a greater number of parts. Application of the seed crystallization process allows the crystallization characteristics of the n layer 5 of the same semiconductor as n+ layer 3, to minimize potential defects in proportion to increased film thickness, thus eventually improving the crystalline characteristics. In addition, since the oxidized monocrystalline film 2 fully isolates the semiconductor device, it also helps promote higher performances of the entire semiconductor device itself.

The invention being thus described, it will be obvious that the same way be varied in many ways. Such variations are not to be regarded as a departure from the spirit and scope of the present invention, and all such modifications are intended to be included within the scope of the following claims.

What is claimed is:

1. A semiconductor substrate comprising:
   a silicon-crystalline substrate;
   a first insulation film formed on said silicon crystalline substrate completely covering a first surface of said silicon crystalline substrate;
   a first monocrystalline semiconductor layer formed on said first insulation film;
   a second insulation film formed on said first monocrystalline semiconductor layer, said second insulation film being provided with at least one aperture; and
   a second monocrystalline semiconductor layer formed on said second insulation film, wherein said second monocrystalline semiconductor layer comprises a crystalline structure having crystallization characteristics identical to that of said first monocrystalline semiconductor layer, and wherein said second monocrystalline semiconductor layer is epitaxially formed by the seed crystallization process.

2. The semiconductor substrate defined in claim 1, wherein said second insulation film contains a plurality of apertures formed in a specific pattern.

3. The semiconductor substrate defined in claim 1, wherein said second insulation film is substantially the an oxidized monocrystalline film.

4. The semiconductor substrate defined in claim 1, wherein said second insulation film is substantially the an amorphous oxidized film.

5. The semiconductor substrate of claim 1 wherein said second insulation film comprises a material selected from the group consisting of $SiO_2$, $Ta_2O_5$, $Al_2O_3$ and $Y_2O_3$.

6. The semiconductor substrate of claim 1 wherein said first and second monocrystalline semiconductor layers comprise gallium arsenate.

7. The semiconductor substrate of claim 1, wherein
   said first insulation film comprises a member selected from the group consisting of zirconia film, spinel film, and sapphire film,
   said first monocrystalline semiconductor layer comprises a member selected from the group consisting of a Group III and IV metal compound, GaAs, and silicon,
   said second insulation film comprises a member selected from the group consisting of an oxidized monocrystalline film, an amorphous oxidized film, $SiO_2$, $Ta_2O_5$, $Al_2O_3$, and $Y_2O_3$, and
   said second monocrystalline semiconductor layer comprises a member selected from the group consisting of a Group III and IV metal compound, GaAs, and a mixture of silicon and As.

8. The semiconductor substrate of claim 7 wherein said first monocrystalline semiconductor layer is formed from $SiH_4$ and $AsH_4$, said second insulation film is oxidized monocrystalline film, and said second monocrystalline semiconductor layer is formed from silicon and As.

9. A semiconductor device comprising: a silicon-crystalline substrate;
   a first insulation film formed on said silicon-crystalline substrate completely covering a first surface of said silicon-crystalline substrate;
   a first monocrystalline semiconductor layer formed on said first insulation film;
   a second insulation film formed on said first monocrystalline semiconductor layer, said second insulation film being provided with first and second apertures;
   a second monocrystalline semiconductor layer formed on said second insulation film, wherein said second monocrystalline semiconductor layer comprises a crystalline structure having crystalline characteristics identical to that of said first monocrystalline semiconductor layer, and wherein said second monocrystalline semiconductor layer is epitaxially formed by the seed crystallization process;

a collector layer formed within said first monocrystalline semiconductor layer, said collector layer having first and second exposed portions provided under said first and second apertures;

a base layer disposed within said first aperture and disposed on said first exposed portion of said collector layer;

an emitter layer disposed on said base layer;

an emitter electrode disposed on said emitter layer; and a collector electrode disosed on said second exposed portion of said collector layer.

10. A method for producing a semiconductor substrate comprising the steps of:

forming a first insulation film on a silicon-crystalline substrate so as to completely cover a first surface of said silicon crystalline substrate;

forming a first monocrystalline semiconductor layer on said first insulation film by use of an epitaxial process;

forming a second insulation layer on said first monocrystalline semiconductor layer;

employing either a reactive ion etching process or a wet etching process to form at least two apertures in said second insulation layer; and forming a second monocrystalline semiconductor layer on said second insulation film by use of a seed crystallization process, wherein said second monocrystalline semiconductor layer comprises a crystalline structure having crystallization characteristics identical to that of said first monocrystalline semiconductor layer.

11. The method as in claim 10 wherein said first monocrystalline semiconductor layer is silicon and is formed on said first insulation layer by use of a silicon epitaxial process, and wherein said second monocrystalline layer is silicon.

12. The method of claim 10, wherein said first insulation film comprises a member selected from the group consisting of zirconia film, spinel film, and sapphire film, said first monocrystalline semiconductor layer comprises a member selected from the group consisting of a Group III and IV metal compound, GaAs, and silicon, said second insulation film comprises a member selected from the group consisting of an oxidized monocrystalline film, an amorphous oxidized film, $SiO_2$, $Ta_2)_5$, $Al_2O_3$, and $Y_2O_3$, and said second monocrystalline semiconductor layer comprises a member selected from the group consisting of a Group III and IV metal compound, GaAs, and a mixture of silicon and As.

13. The method of claim 12 wherein said first monocrystalline semiconductor layer is formed from $SiH_4$ and $AsH_4$, said second insulation film is oxidized monocrystalline film, and said second monocrystalline semiconductor layer is formed from silicon and As.

* * * * *